United States Patent
Lo et al.

(10) Patent No.: US 12,350,719 B2
(45) Date of Patent: Jul. 8, 2025

(54) DRAWER-REPLACED CLEANING APPARATUS

(71) Applicant: GUDENG EQUIPMENT CO., LTD., New Taipei (TW)

(72) Inventors: Ming-Mo Lo, New Taipei (TW); Lin-Hsin Tu, New Taipei (TW)

(73) Assignee: GUDENG EQUIPMENT CO., LTD., New Taipei (TW)

(*) Notice: Subject to any disclaimer, the term of this patent is extended or adjusted under 35 U.S.C. 154(b) by 504 days.

(21) Appl. No.: 17/989,709

(22) Filed: Nov. 18, 2022

(65) Prior Publication Data

US 2023/0149986 A1 May 18, 2023

(30) Foreign Application Priority Data

Nov. 18, 2021 (TW) ................................ 110142942

(51) Int. Cl.
*B08B 13/00* (2006.01)
*B08B 1/20* (2024.01)
*G03F 1/82* (2012.01)
*H01L 21/02* (2006.01)

(52) U.S. Cl.
CPC ................ *B08B 13/00* (2013.01); *B08B 1/20* (2024.01); *G03F 1/82* (2013.01); *H01L 21/02041* (2013.01)

(58) Field of Classification Search
CPC .. B08B 13/00; B08B 1/00; B08B 1/20; G03F 1/82; H01L 21/02041
See application file for complete search history.

(56) References Cited

U.S. PATENT DOCUMENTS 9,107,494 B2 * 8/2015 Scheuring ............. F25D 25/025

FOREIGN PATENT DOCUMENTS

CN 108831846 A * 11/2018
CN 110302985 A * 10/2019 ............. B08B 1/002

* cited by examiner

*Primary Examiner* — C. A. Rivera

(57) ABSTRACT

A drawer-replaced cleaning apparatus comprises: a box, at least one cleaning module and a lifting power module, the box has an accommodating space and a drawer, the drawer is located in the accommodating space, and may be pulled out from one side of the box, a bottom surface of the drawer has at least one mounting slot, the at least one cleaning module is detachably disposed in the mounting slot, the lifting power module is located in the accommodating space, and disposed below the cleaning module, the lifting power module passes through the mounting slot to push the cleaning module up away from the drawer, and the lifting power module is lowered so that the cleaning module is relocated in the mounting slot. The present disclosure solves the problem that the cleaning module of the prior art is difficult to replace.

10 Claims, 6 Drawing Sheets

DRAWER-REPLACED CLEANING APPARATUS

CROSS-REFERENCE TO RELATED APPLICATION

This non-provisional application claims priority under 35 U.S.C. § 119(a) on Patent Application No(s). 110142942 filed in Taiwan, R.O.C. on Nov. 18, 2021, the entire contents of which are hereby incorporated by reference.

BACKGROUND OF THE INVENTION

1. Field of the Invention

The present application relates to a cleaning apparatus, and in particular to a drawer-replaced cleaning apparatus.

2. Description of the Related Art

In order to meet the needs of cleanliness, electrostatic discharge and so on, the current cleaning apparatus on the market, especially for the cleaning apparatus of semiconductors, electronic products and other related objects has become quite complicated, and wherein the cleaning module is not easy to replace. Each replacement of the cleaning module will take a lot of time, resulting in an increase in the cost of replacement and a decrease in the willingness to replace, so that the need for cleaning products cannot be effectively met.

BRIEF SUMMARY OF THE INVENTION

Therefore, in order to solve the various problems of the traditional cleaning apparatus, the disclosure provides a drawer-replaced cleaning apparatus.

To achieve the above objective and other objectives, the present disclosure provides a drawer-replaced cleaning apparatus, which comprises: a box, having an accommodating space and a drawer, the drawer is located in the accommodating space, and may be pulled out from one side of the box, a bottom surface of the drawer has at least one mounting slot; at least one cleaning module, detachably disposed in the mounting slot; and a lifting power module, located in the accommodating space, and disposed below the cleaning module, the lifting power module passes through the mounting slot to push the cleaning module up away from the drawer, and the lifting power module is lowered so that the cleaning module is relocated in the mounting slot.

In an embodiment of the disclosure, a top end of the lifting power module and the cleaning module adsorbs to each other.

In an embodiment of the disclosure, the top end of the lifting power module and the cleaning module are magnetically adsorbed to each other.

In an embodiment of the disclosure, an outer periphery of the cleaning module is larger than the mounting slot.

In an embodiment of the disclosure, a periphery section of the mounting slot is trapezoidal.

In an embodiment of the disclosure, the number of both the cleaning modules and the mounting slots are two, the lifting power module passes through the two mounting slots to push the two cleaning modules up.

In an embodiment of the disclosure, the two mounting slots are connected to each other.

In an embodiment of the disclosure, the drawer-replaced cleaning apparatus further comprises a clamping module, disposed above the box.

In an embodiment of the disclosure, the clamping module includes a chuck and a power arm, the power arm is connected to the chuck by power, and drives the chuck to move.

In an embodiment of the disclosure, the drawer-replaced cleaning device further comprises a control module and an electrostatic real-time monitoring module, the control module is connected to the lifting power module and the electrostatic real-time monitoring module by signal.

Accordingly, it is very effortless to replace the cleaning module from the drawer-replaced cleaning apparatus of the present disclosure, allowing the cleaning module to be replaced in a high frequency, in order to easily maintain the cleanliness of the object to be cleaned.

DETAILED DESCRIPTION OF THE INVENTION

Figure 1:
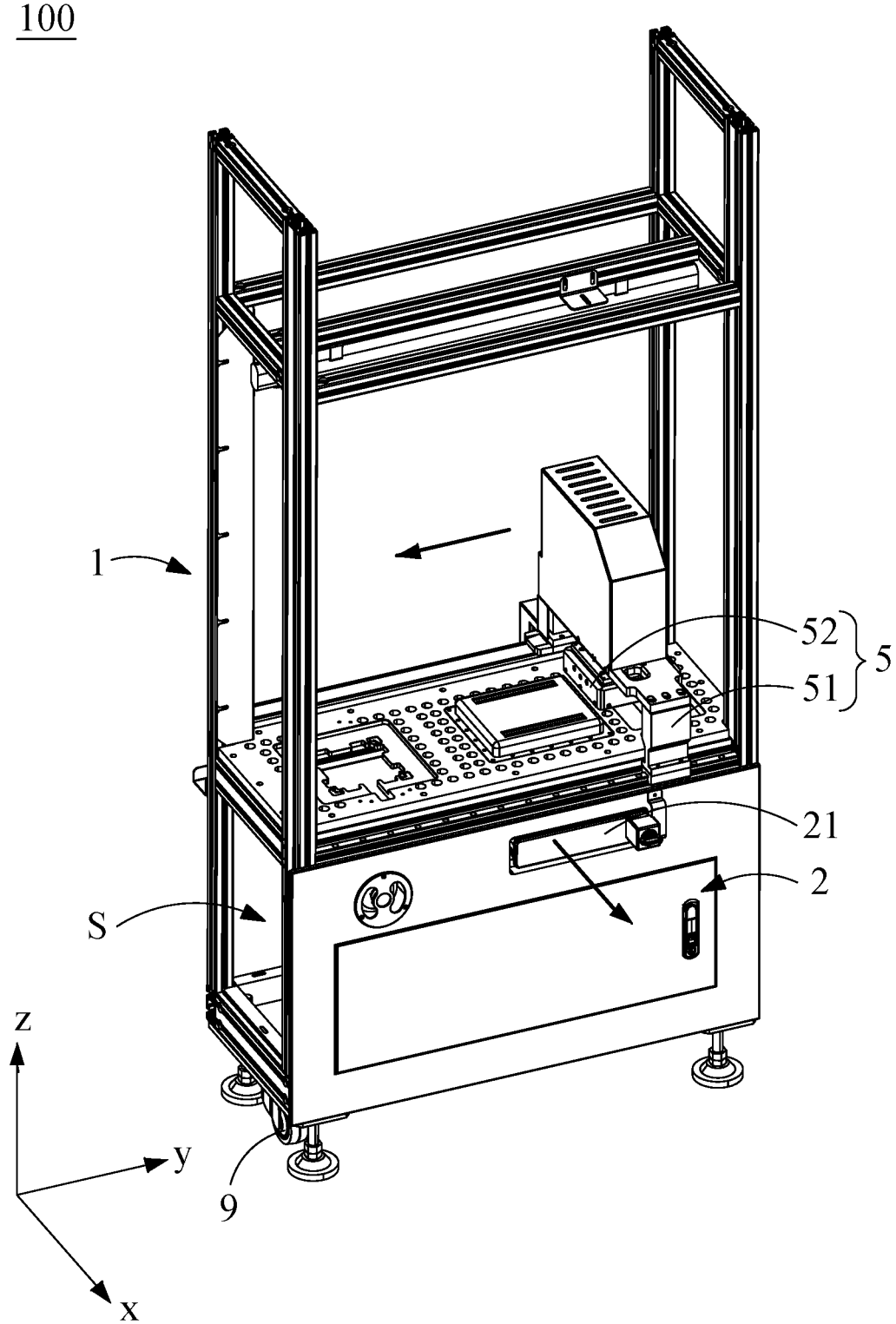
FIG. 1 is a schematic outside view of a drawer-replaced cleaning apparatus according to an embodiment of the present disclosure.
Figure 2:
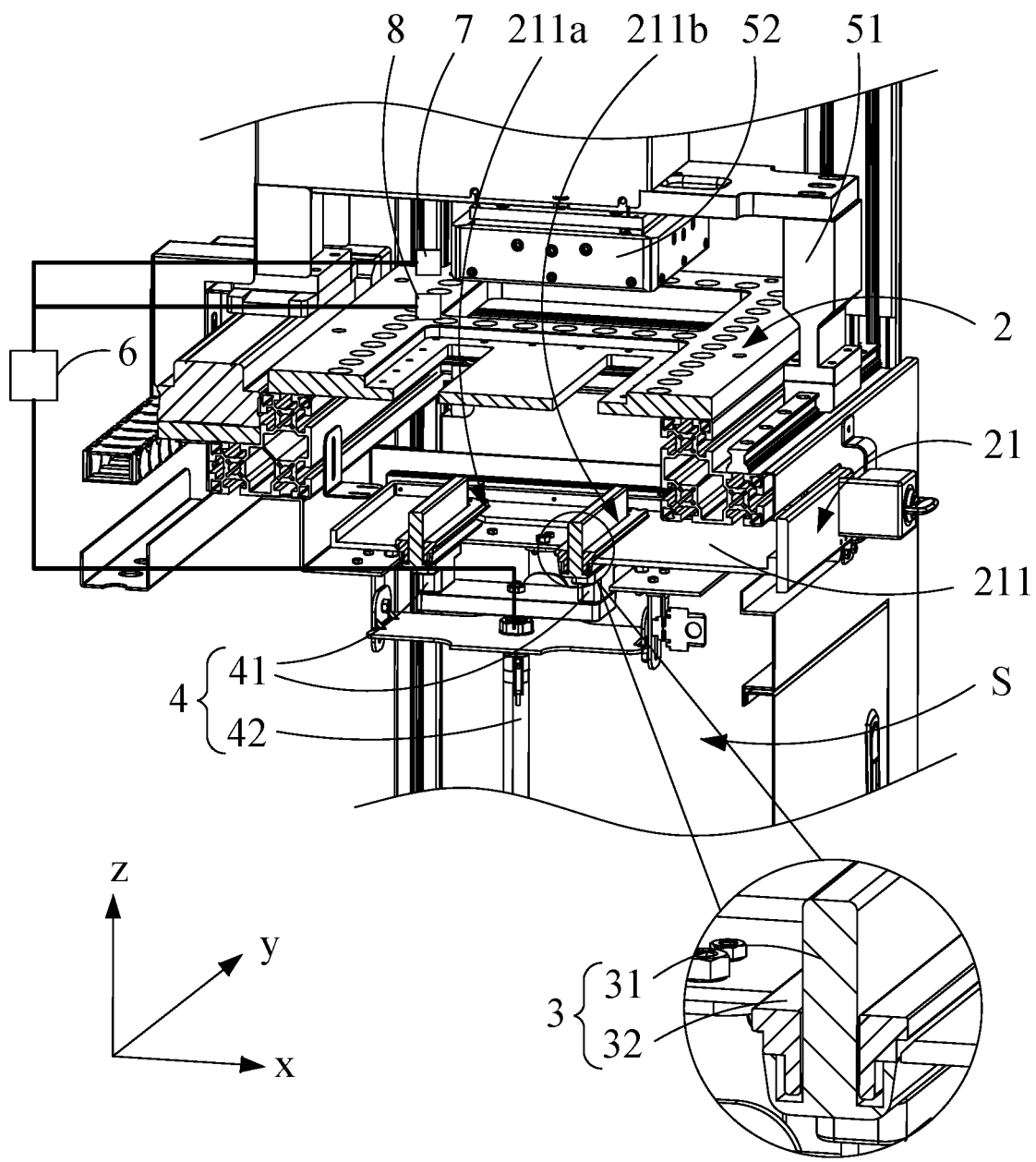
FIG. 2 is a schematic sectional view of the drawer-replaced cleaning apparatus according to the embodiment of the present disclosure.
Figure 5:
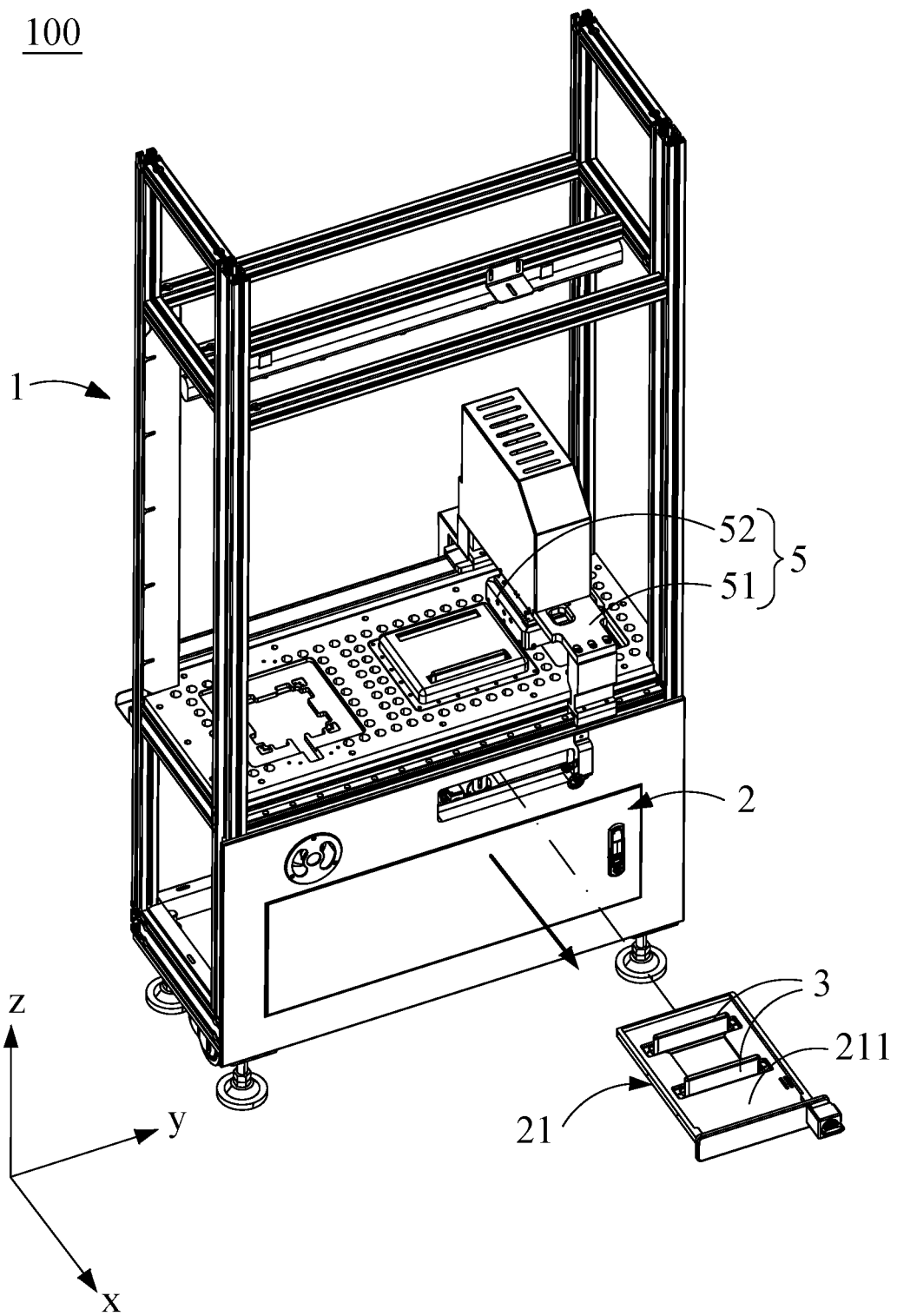
FIG. 5 is a schematic view of pulling the drawer out and replacing the cleaning module according to the embodiment of the present disclosure.

To facilitate understanding of the present application, embodiments together with the attached drawings for the detailed description of the present application are provided. One skilled in the art can understand the object, characteristics and effects of this present application by the content described in the specification. It should be noted that various possible modifications and alterations to the details of the specification could be carried out by implementing or applying other different embodiments based on different views and applications without departing from the spirit of the present application. The related technical contents of the application will be described in detail by the embodiments. However, the disclosed contents should not be considered to limit the scope of the application. The description is provided as follows:

As shown in FIG. 1, FIG. 2 and FIG. 5, the drawer-replaced cleaning apparatus 100 of an embodiment of the present disclosure comprises: a box 2, at least one cleaning module 3 and a lifting power module 4.

Figure 6:
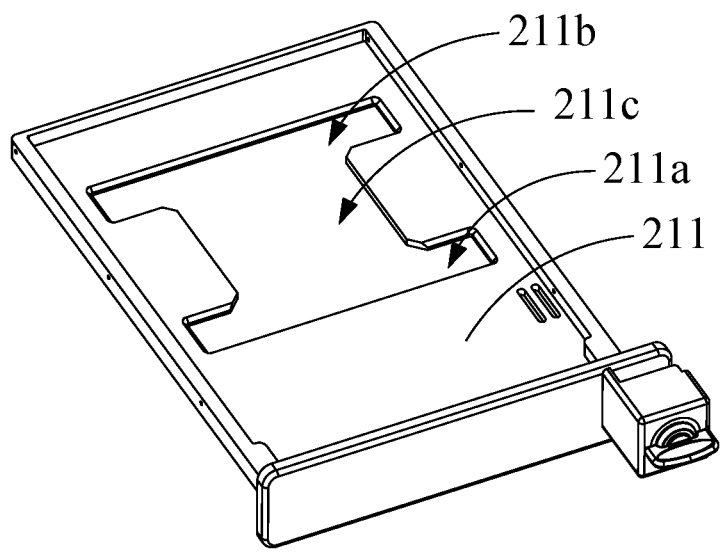
FIG. 6 is a schematic perspective view of the drawer according to the embodiment of the present disclosure.

The box 2 has an accommodating space S and a drawer 21, the drawer 21 is located in the accommodating space S, and may be pulled out from one side of the box 2, a bottom surface 211 of the drawer 21 has at least one mounting slot 211*a* (referring to FIG. 6).

As shown in FIG. 2, at least one cleaning module 3 is detachably disposed in the mounting slot 211*a*. In the present embodiment, the cleaning module 3 includes a cleaning cloth member 31 and a bearing case 32, the cleaning cloth member 31 is disposed in the bearing case 32 to wipe the object to be cleaned (not shown), the cleaning cloth member 31 is a dust-free cloth (anti-static material electronic grade clean room special wipe). The bearing case 32 is detachably mounted in the mounting slot 211a from a top of the drawer 21, however, the present disclosure is not limited thereto, the structure and material of the cleaning module 3 may be changed. In the present embodiment, the object to be cleaned is a photomask, the cleaning cloth member 31 wipes the outside of the photomask protective film, however, the present disclosure is not limited thereto, the object to be cleaned may be other kinds of products, such as circuit boards or other electronic elements.

Figure 3:
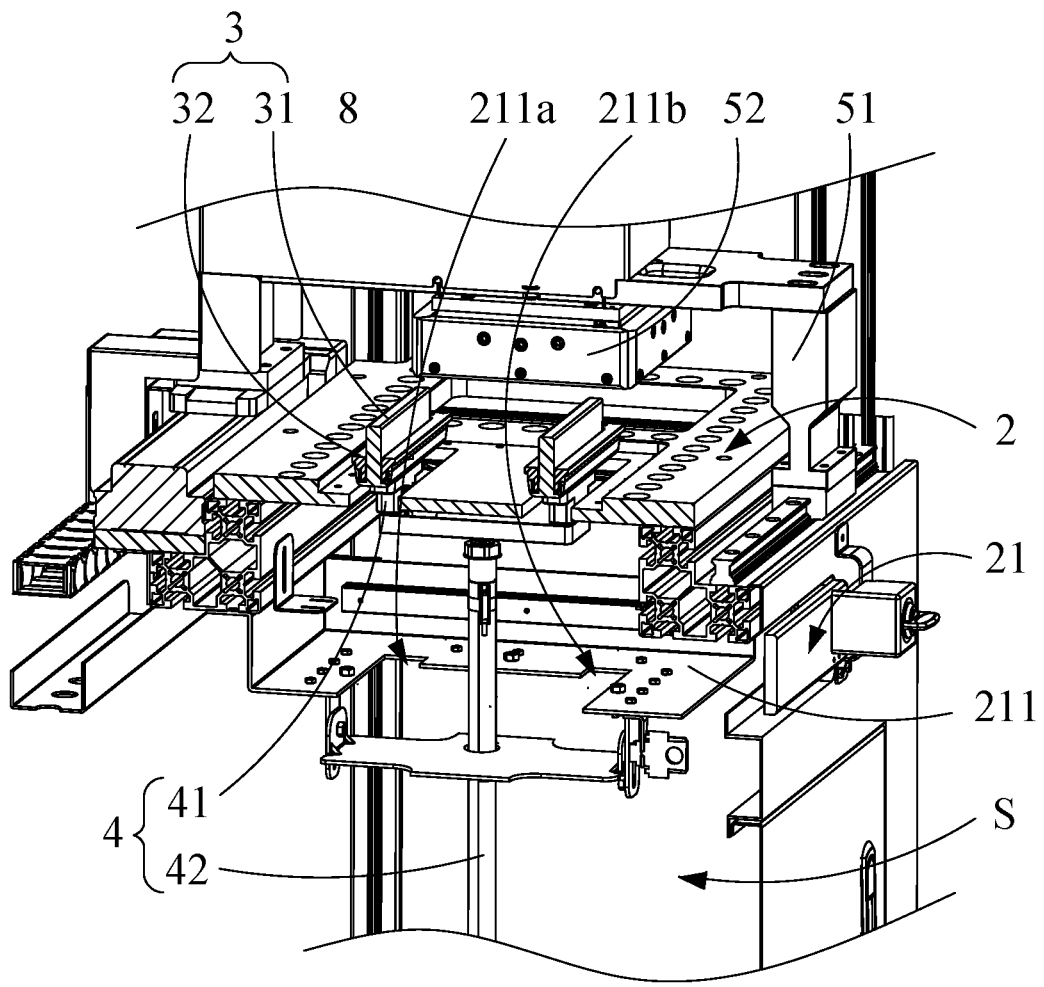
FIG. 3 is a schematic view of a lifting power module pushing a cleaning module up according to the embodiment of the present disclosure.
Figure 3:
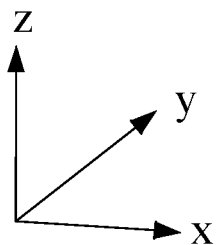

The lifting power module 4 is located in the accommodating space S, and disposed below the cleaning module 3. As shown in FIG. 3, the lifting power module 4 passes through the mounting slot 211a to push the cleaning module 3 up away from the drawer 21, and contact with the object to be cleaned. Depending on the design, the lifting power module 4 can push the cleaning module 3 up to the top surface of the box 2 or even exceed the box 2; the lifting power module 4 may also push the cleaning module 3 but still let the cleaning module 3 located in the accommodating space S (i.e., not higher than the top surface of the box 2), the object to be cleaned is moved to the accommodating space S in contact with the cleaning module 3. The lifting power module 4 is an electric actuating member, such as a cylinder, a stepper motor or a servo motor.

Figure 4:
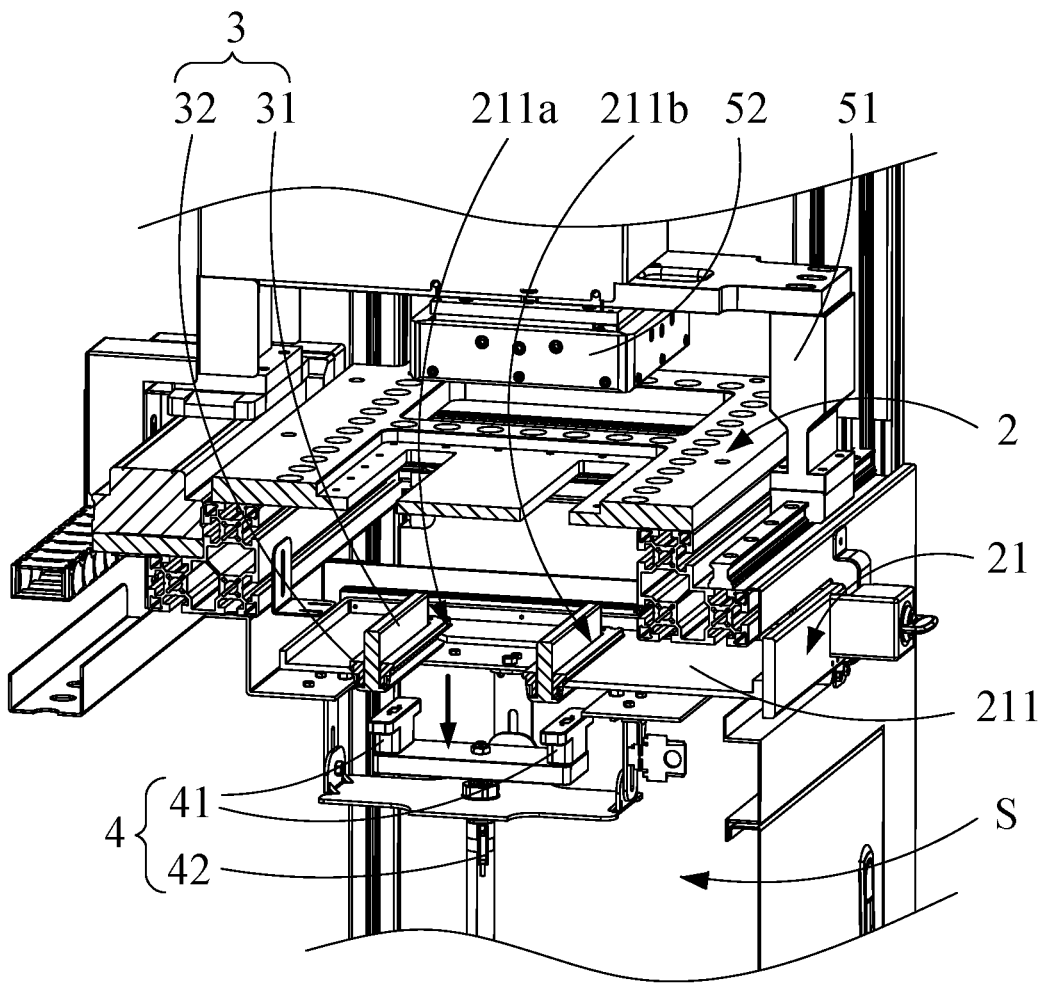
FIG. 4 is a schematic view of reposition of the cleaning module according to the embodiment of the present disclosure.

As shown in FIG. 4, when the cleaning module 3 finishes the cleaning or needs to be replaced, the lifting power module 4 is lowered so that the cleaning module 3 is relocated in the mounting slot 211a. The lifting power module 4 continues to lower, the cleaning module 3 is supported by the bottom surface 211 of the drawer 21 and separated from the lifting power module 4.

As shown in FIG. 5, since the lifting power module 4 and the cleaning module 3 have been separated, after the drawer 21 is pulled out, the cleaning module 3 can be easily and directly replaced (the old cleaning cloth member 31 can be removed or the entire cleaning module 3 is directly replaced). When a new cleaning module 3 is placed in the mounting slot 211a, the drawer is inserted back into the box 2 again to continue the cleaning process. Relative to the prior art, it is very effortless to replace the cleaning module 3 from the drawer-replaced cleaning apparatus 100 of the present disclosure, allowing the cleaning module 3 to be replaced in a high frequency, in order to easily maintain the cleanliness of the object to be cleaned.

Further, in the present embodiment, a top end of the lifting power module 4 (adsorption head 41) and a base of the cleaning module 3 (bearing case 32) adsorbs to each other. When the adsorption head 41 and the bearing case 32 adsorb each other, the synchronous movement of the two will be more stable to avoid separation or dislocation caused by vibration, inertia and other factors during the movement. In the present embodiment, the top end of the lifting power module 4 (adsorption head 41) and the base of the cleaning module 3 (bearing case 32) are magnetically adsorbed to each other, i.e., at least one of the two is a ferromagnetic material, the other is a paramagnetic material or is also a ferromagnetic material. However, the present disclosure is not limited thereto, in other embodiments, the adsorption head 41 and the bearing case 32 may be adsorbed to each other by the application of other principles, such as airflow adsorption. These adsorptions are mainly easy to control and separate electrically.

Further, as shown in FIG. 2, in the present embodiment, an outer periphery of the cleaning module 3 is larger than the mounting slot 211a. Therefore, when the cleaning module 3 is mounted from the top of the bottom surface 211, the cleaning module 3 may be stuck in the mounting slot 211a. In order to make the cleaning module 3 more firmly located in the mounting slot 211a without falling down, preferably a lower part of the cleaning module 3 may be slightly smaller than the mounting slot 211a, so that a part of the cleaning module 3 passes through the mounting slot 211a, the part of the outer periphery that is greater than the mounting slot 211a is stuck in the mounting slot 211a, thereby achieving a stable effect. However, the present disclosure is not limited thereto, in other embodiments, the shapes of the cleaning module 3 and the mounting slot 211a may have different forms and patterns.

Further, as shown in FIG. 2, in the present embodiment, a periphery section of the mounting slot 211a is trapezoidal, a trapezoidal bevel is used to dispersedly support the weight of the cleaning module 3 in order to avoid the deformation of the drawer 21, and can also guide the installation of the cleaning module 3.

Further, as shown in FIG. 2, in the present embodiment, the number of both the cleaning modules 3 and the mounting slots are two (mounting slots 211a, 211b), the lifting power module 4 passes through the two mounting slots 211a, 211b to push the two cleaning modules 3 up. The two cleaning modules 3 are separated from each other at a certain distance for cleaning the two sides of the photomask protective film in the present embodiment. However, the present disclosure is not limited thereto, in other embodiments, the number of the cleaning modules 3 and the mounting slots may be changed as necessary.

Further, as shown in FIGS. 2 to 6, in the present embodiment, the two mounting slots 211a, 211b are connected to each other. The purpose of connecting to each other is to enable a lifting rod 42 of the lifting power module 4 to pass, wherein one end of the lifting rod 42 is connected to a power source (not shown), and the other end of the lifting rod 42 is connected to the two adsorption heads 41. However, the present disclosure is not limited thereto, in other embodiments, the setting of the lifting rod 42 may be changed to make the lifting rod 42 not pass through the drawer 21 in the movement stroke of the lifting power module 4, so the two mounting slots 211a, 211b do not need to be connected to each other. In other embodiments, the two cleaning modules 3 are independently driven by two lifting power modules 4, in this case the two mounting slots 211a, 211b do not need to be connected to each other.

In the present embodiment, as shown in FIG. 6, a length of a connecting part 211c is slightly shorter than two mounting slots 211a, 211b, so that the two cleaning modules 3 are each firmly located in the mounting slots 211a, 211b, however, the present disclosure is not limited thereto.

Further, as shown in FIG. 1, the drawer-replaced cleaning apparatus 100 further comprises a clamping module 5, disposed above the box 2, for clamping an object to be cleaned. In the present embodiment, the clamping module 5 clamps the object to be cleaned in a manner of air flow suction, however, the present disclosure is not limited thereto, may clamp by direct mechanical contact in mechanics, or clamps by using electromagnetism and other scientific principles.

Further, as shown in FIG. 1, the clamping module 5 includes a chuck 52 and a power arm 51, the power arm 51 is connected to the chuck 52 by power, and drives the chuck 52 to move (as shown by the arrow). The power arm 51, for example, is a stepper motor or servo motor or other electrically actuated member. By the movable clamping module 5, the object to be cleaned may be clamped to the top of the cleaning module 3 and wiped.

Further, as shown in FIG. 2, in the present embodiment, the drawer-replaced cleaning device 100 further comprises a control module 6 and an electrostatic real-time monitoring module 7, the control module 6 is connected to the lifting power module 4, the power arm 51 and the electrostatic real-time monitoring module 7 by signal. The electrostatic real-time monitoring module 7 detects the static electricity of the environment, the object to be cleaned or the apparatus, and the control module 6 determines whether to stop cleaning or let the electrostatic real-time monitoring module 7 release the neutralizing charge in real time according to the detection data of the electrostatic real-time monitoring module 7. The control module 6, for example, is a control chip or a control circuit.

Further, as shown in FIG. 2, in the present embodiment, the drawer-replaced cleaning device 100 further comprises a skew rectifying module 8, connected to control module 6 by signal. The control module 6 determines whether the object to be cleaned clamped by the clamping module 5 is skewed according to the detection signal of the skew rectifying module 8, and controls the lifting power module 4 to stop cleaning, the power arm 51 adjusts the position or returns to the original position. The skew rectifying module 8, for example, is a device using the principle of optical skew rectification, using an emitted light (usually infrared) and judging whether the reflected signal or the receiving signal on the other side is abnormal, thereby determining whether the object to be cleaned is skewed during the process of movement. However, the present disclosure is not limited thereto, the skew rectifying module 8 may be a skew rectifying device applying other principles.

Further, as shown in FIG. 1, in the present embodiment, the drawer-replaced cleaning device 100 further comprises a frame 1 and a set of moving wheels 9, the box 2 is disposed in frame 1, the moving wheels 9 are disposed at a bottom of the frame 1. The frame 1 makes components of the drawer-replaced cleaning apparatus 100 integrated, the moving wheels 9 can make each component move together with the frame 1.

While the present application has been described by means of specific embodiments, those skilled in the art should understand the above description is merely embodiments of the application, and it should not be considered to limit the scope of the application. It should be noted that all changes and substitutions which come within the meaning and range of equivalency of the embodiments are intended to be embraced in the scope of the application. Therefore, the scope of the application is defined by the claims.

What is claimed is:

1. A drawer-replaced cleaning apparatus, comprising:
    a box, having an accommodating space and a drawer, the drawer is located in the accommodating space, and may be pulled out from one side of the box, a bottom surface of the drawer has at least one mounting slot;
    at least one cleaning module, detachably disposed in the mounting slot; and
    a lifting power module, located in the accommodating space, and disposed below the cleaning module, the lifting power module passes through the mounting slot to push the cleaning module up away from the drawer, and the lifting power module is lowered so that the cleaning module is relocated in the mounting slot.

2. The drawer-replaced cleaning apparatus according to claim 1, wherein a top end of the lifting power module and the cleaning module adsorbs to each other.

3. The drawer-replaced cleaning apparatus according to claim 2, wherein the top end of the lifting power module and the cleaning module are magnetically adsorbed to each other.

4. The drawer-replaced cleaning apparatus according to claim 1, wherein an outer periphery of the cleaning module is larger than the mounting slot.

5. The drawer-replaced cleaning apparatus according to claim 1, wherein a periphery section of the mounting slot is trapezoidal.

6. The drawer-replaced cleaning apparatus according to claim 1, wherein the number of both the cleaning modules and the mounting slots are two, the lifting power module passes through the two mounting slots to push the two cleaning modules up.

7. The drawer-replaced cleaning apparatus according to claim 6, wherein the two mounting slots are connected to each other.

8. The drawer-replaced cleaning apparatus according to claim 1, further comprising a clamping module, disposed above the box.

9. The drawer-replaced cleaning apparatus according to claim 8, wherein the clamping module includes a chuck and a power arm, the power arm is connected to the chuck by power, and drives the chuck to move.

10. The drawer-replaced cleaning apparatus according to claim 8, further comprising a control module and an electrostatic real-time monitoring module, the control module is connected to the lifting power module and the electrostatic real-time monitoring module by signal.

* * * * *